US011736065B2

(12) United States Patent
Meyer et al.

(10) Patent No.: US 11,736,065 B2
(45) Date of Patent: Aug. 22, 2023

(54) METHOD AND APPARATUS FOR CONVEYING CLOCK-RELATED INFORMATION FROM A TIMING DEVICE

(71) Applicant: Microchip Technology Inc., Chandler, AZ (US)

(72) Inventors: Peter Meyer, Ottawa (CA); Kamran Rahbar, Kanata (CA)

(73) Assignee: Microchip Technology Inc., Chandler, AZ (US)

(*) Notice: Subject to any disclaimer, the term of this patent is extended or adjusted under 35 U.S.C. 154(b) by 0 days.

(21) Appl. No.: 17/884,889

(22) Filed: Aug. 10, 2022

(65) Prior Publication Data

US 2023/0113151 A1 Apr. 13, 2023

Related U.S. Application Data

(60) Provisional application No. 63/253,478, filed on Oct. 7, 2021.

(51) Int. Cl.
*H03B 5/36* (2006.01)
*H03K 19/173* (2006.01)
(Continued)

(52) U.S. Cl.
CPC .................. *H03B 5/36* (2013.01); *H03B 5/04* (2013.01); *H03K 3/017* (2013.01); *H03K 19/1737* (2013.01)

(58) Field of Classification Search
CPC ....................................................... H03B 5/36
(Continued)

(56) References Cited

U.S. PATENT DOCUMENTS 5,343,482 A   8/1994   Penner et al.
5,361,277 A   11/1994  Grover
(Continued)

FOREIGN PATENT DOCUMENTS

DE         60216803 T2    11/2007
DE       102017222442 A1   6/2019
(Continued)

OTHER PUBLICATIONS

"IEEE 802.3 IEEE Standard for Ethernet Clause 82", IEEE, 2012.
(Continued)

*Primary Examiner* — Joseph Chang
(74) *Attorney, Agent, or Firm* — Glass and Associates; Kenneth Glass

(57) ABSTRACT

A timing device includes an oven having a chamber, a crystal oscillator disposed in the chamber that generates a clock signal, and one or more sensors to generate operational characteristic signals indicative of respective operational characteristics of the crystal oscillator or the oven. The timing device includes a plurality of I/O connections and an IC device. The IC device includes processing logic to generate information that indicates how the generated clock signal is to be modified and a modulator coupled to the processing logic and the crystal oscillator. The modulator modulates the generated clock signal in relation to the information to generate a modulated clock signal indicative of the one or more operational characteristics of the crystal oscillator or the oven. The modulator outputs the modulated clock signal over a single one of the plurality of I/O connections.

20 Claims, 15 Drawing Sheets

(51) Int. Cl.
*H03K 3/017* (2006.01)
*H03B 5/04* (2006.01)

(58) Field of Classification Search
USPC .................................................. 331/158
See application file for complete search history.

(56) References Cited

U.S. PATENT DOCUMENTS

| | | |
|---|---|---|
| 5,371,765 A | 12/1994 | Guilford |
| 5,600,824 A | 2/1997 | Williams et al. |
| 5,640,398 A | 6/1997 | Carr et al. |
| 5,838,512 A | 11/1998 | Okazaki |
| 5,850,422 A | 12/1998 | Chen |
| 5,905,766 A | 5/1999 | Nguyen |
| 6,044,122 A | 3/2000 | Ellersick et al. |
| 6,052,073 A | 4/2000 | Carr et al. |
| 6,138,061 A | 10/2000 | McEnnan et al. |
| 6,150,965 A | 11/2000 | Carr et al. |
| 6,188,699 B1 | 2/2001 | Lang et al. |
| 6,333,935 B1 | 12/2001 | Carr et al. |
| 6,345,052 B1 | 2/2002 | Tse et al. |
| 6,359,479 B1 | 3/2002 | Oprescu |
| 6,501,340 B1 * | 12/2002 | Flood ............... H03L 1/04 310/318 |
| 6,584,521 B1 | 6/2003 | Dillabough et al. |
| 6,603,776 B1 | 8/2003 | Fedders et al. |
| 6,668,297 B1 | 12/2003 | Karr et al. |
| 6,671,758 B1 | 12/2003 | Cam et al. |
| 6,744,787 B1 | 6/2004 | Schatz et al. |
| 6,820,159 B2 | 11/2004 | Mok et al. |
| 6,823,001 B1 | 11/2004 | Chea |
| 6,870,831 B2 | 3/2005 | Hughes et al. |
| 7,117,112 B2 | 10/2006 | Mok |
| 7,161,999 B2 | 1/2007 | Parikh |
| 7,165,003 B2 | 1/2007 | Mok |
| 7,187,741 B2 | 3/2007 | Pontius et al. |
| 7,203,616 B2 | 4/2007 | Mok |
| 7,239,650 B2 | 7/2007 | Rakib et al. |
| 7,239,669 B2 | 7/2007 | Cummings et al. |
| 7,295,945 B2 | 11/2007 | Mok |
| 7,388,160 B2 | 6/2008 | Mok et al. |
| 7,417,985 B1 | 8/2008 | McCrosky et al. |
| 7,468,974 B1 | 12/2008 | Carr et al. |
| 7,492,760 B1 | 2/2009 | Plante et al. |
| 7,593,411 B2 | 9/2009 | McCrosky et al. |
| 7,656,791 B1 | 2/2010 | Mok et al. |
| 7,668,210 B1 | 2/2010 | Mok et al. |
| 7,751,411 B2 | 7/2010 | Cam et al. |
| 7,772,898 B2 | 8/2010 | Cheung |
| 7,807,933 B2 | 10/2010 | Mok et al. |
| 7,817,673 B2 | 10/2010 | Scott et al. |
| 8,010,355 B2 | 8/2011 | Rahbar |
| 8,023,641 B2 | 9/2011 | Rahbar |
| 8,068,559 B1 | 11/2011 | Butcher |
| 8,085,764 B1 | 12/2011 | McCrosky et al. |
| 8,243,759 B2 | 8/2012 | Rahbar |
| 8,335,319 B2 | 12/2012 | Rahbar |
| 8,413,006 B1 | 4/2013 | Mok et al. |
| 8,428,203 B1 | 4/2013 | Zortea et al. |
| 8,483,244 B2 | 7/2013 | Rahbar |
| 8,542,708 B1 | 9/2013 | Mok et al. |
| 8,599,986 B2 | 12/2013 | Rahbar |
| 8,774,227 B2 | 7/2014 | Rahbar |
| 8,854,963 B1 | 10/2014 | Muma et al. |
| 8,913,688 B1 | 12/2014 | Jenkins |
| 8,957,711 B2 | 2/2015 | Jin et al. |
| 8,971,548 B2 | 3/2015 | Rahbar et al. |
| 8,976,816 B1 | 3/2015 | Mok et al. |
| 8,989,222 B1 | 3/2015 | Mok et al. |
| 9,019,997 B1 | 4/2015 | Mok et al. |
| 9,025,594 B1 | 5/2015 | Mok et al. |
| 9,209,965 B2 | 12/2015 | Rahbar et al. |
| 9,276,874 B1 | 3/2016 | Mok et al. |
| 9,313,563 B1 | 4/2016 | Mok et al. |
| 9,337,960 B2 | 5/2016 | Zhong |
| 9,374,265 B1 | 6/2016 | Mok et al. |
| 9,444,474 B2 | 9/2016 | Rahbar et al. |
| 9,473,261 B1 | 10/2016 | Fse et al. |
| 9,503,254 B2 | 11/2016 | Rahbar et al. |
| 9,525,482 B1 | 12/2016 | Tse |
| 10,069,503 B2 | 9/2018 | Zhang et al. |
| 10,079,651 B2 | 9/2018 | Ramachandra |
| 10,104,047 B2 | 10/2018 | Muma et al. |
| 10,128,826 B2 | 11/2018 | Jin et al. |
| 10,218,823 B2 | 2/2019 | Gareau |
| 10,250,379 B2 | 4/2019 | Haddad et al. |
| 10,397,088 B2 | 8/2019 | Gareau |
| 10,432,553 B2 | 10/2019 | Tse |
| 10,594,423 B1 | 3/2020 | Anand et al. |
| 10,608,647 B1 | 3/2020 | Ranganathan et al. |
| 10,715,307 B1 | 7/2020 | Jin |
| 10,797,816 B1 | 10/2020 | Gorshe et al. |
| 10,917,097 B1 | 2/2021 | Meyer et al. |
| 11,108,895 B2 | 8/2021 | Mok et al. |
| 11,128,742 B2 | 9/2021 | Gorshe et al. |
| 11,239,933 B2 | 2/2022 | Mok et al. |
| 2001/0056512 A1 | 12/2001 | Mok et al. |
| 2002/0158700 A1 | 10/2002 | Nemoto |
| 2004/0082982 A1 | 4/2004 | Gord et al. |
| 2005/0110524 A1 | 5/2005 | Glasser |
| 2006/0056560 A1 | 3/2006 | Aweya et al. |
| 2006/0064716 A1 | 3/2006 | Sull et al. |
| 2006/0076988 A1 | 4/2006 | Kessels et al. |
| 2007/0036173 A1 | 2/2007 | McCrosky et al. |
| 2007/0064834 A1 | 3/2007 | Yoshizawa |
| 2007/0132259 A1 | 6/2007 | Ivannikov et al. |
| 2008/0000176 A1 | 1/2008 | Mandelzys et al. |
| 2008/0202805 A1 | 8/2008 | Mok et al. |
| 2010/0052797 A1 | 3/2010 | Carley et al. |
| 2010/0150271 A1 | 6/2010 | Brown et al. |
| 2011/0095830 A1 | 4/2011 | Tsangaropoulos et al. |
| 2012/0158990 A1 | 6/2012 | Losio et al. |
| 2014/0055179 A1 | 2/2014 | Gong et al. |
| 2014/0139275 A1 | 5/2014 | Dally et al. |
| 2014/0149821 A1 | 5/2014 | Zhou et al. |
| 2015/0117177 A1 | 4/2015 | Ganga et al. |
| 2016/0020872 A1 | 1/2016 | Zhong |
| 2016/0277030 A1 | 9/2016 | Burbano et al. |
| 2016/0301669 A1 | 10/2016 | Muma et al. |
| 2016/0315634 A1 | 10/2016 | Mei et al. |
| 2017/0005949 A1 | 1/2017 | Gareau |
| 2017/0171163 A1 | 6/2017 | Gareau et al. |
| 2017/0244648 A1 | 8/2017 | Tse |
| 2018/0131378 A1 | 5/2018 | Haroun et al. |
| 2018/0145928 A1 | 5/2018 | Zhong et al. |
| 2018/0159541 A1 | 6/2018 | Spijker |
| 2018/0159785 A1 | 6/2018 | Wu et al. |
| 2018/0183708 A1 | 6/2018 | Farkas et al. |
| 2019/0097758 A1 | 3/2019 | Huang et al. |
| 2019/0394309 A1 | 12/2019 | Caldwell et al. |
| 2020/0018794 A1 | 1/2020 | Uehara |
| 2020/0067827 A1 | 2/2020 | Mei et al. |
| 2020/0166912 A1 | 5/2020 | Schneider et al. |
| 2020/0287998 A1 | 9/2020 | Gorshe et al. |
| 2020/0295874 A1 | 9/2020 | Cheng et al. |
| 2020/0296486 A1 | 9/2020 | Xiang et al. |
| 2020/0396097 A1 | 12/2020 | Deng et al. |
| 2021/0385310 A1 | 12/2021 | Gorshe et al. |

FOREIGN PATENT DOCUMENTS

| | | |
|---|---|---|
| EP | 1145477 A1 | 10/2001 |
| JP | 3565600 B2 | 9/2004 |
| JP | 3565600 B2 | 9/2004 |
| KR | 101028593 B1 | 4/2011 |
| WO | 2003039061 A3 | 10/2003 |
| WO | 2020185247 A1 | 9/2020 |
| WO | 2021040762 A1 | 3/2021 |
| WO | 2021151187 A1 | 8/2021 |

(56) References Cited

OTHER PUBLICATIONS

"ITU-T Recommendation G.709 Interfaces for the Optical Transport Networks", ITU-T G.709/Y.1331, International Telecommunication Union, Jun. 2016.
"MEF 8 Implementation Agreement for the Emulation of PDH Circuits over Metro Ethernet Networks", Metro Ethernet Forum, Oct. 2004.
8A34003 Datasheet (Integrated Device Technology, Inc) Jun. 17, 2019 (Jun. 17, 2019).
Abdo Ahmad et al: "Low-Power Circuit for Measuring and Compensating Phase Interpolator Non-Linearity", 2019 IEEE 10th Annual Information Technology, Electronics and Mobile Communication Conference (IEMCON), IEEE, Oct. 17, 2019 (Oct. 17, 2019), pp. 310-313.
Eyal Oren Broadcom Limited USA, "MTN Section Layer frame and Path layer format considerations;C1522", ITU-T Draft; Study Period 2017-2020; Study Group 15; Series C1522, International Telecommunication Union, Geneva ; CH, Geneva ; CH, (Jun. 18, 2019), vol. 11/15, pp. 1-4, XP044270354.
ITU-T Draft, "Interfaces for the metro transport network; g8312", Study period 2017-2020; Study Group 15; Series 8312, International Telecommunication Union, Geneva, Switzerland, Nov. 2020.
ITU-T G.8013/Y.1731, "Operation, administration and maintenance (OAM) functions and mechanisms for Ethernet-based networks", International Telecommunication Union, Geneva, Switzerland, Aug. 2015.
Maarten Vissers, "FlexE aware mapping method 6B text proposal;CD11-106", ITU-T Draft; Study Period 2013-2016, International Telecommunication Union, Geneva; CH, vol. 11/15, Jan. 12, 2016 (Jan. 12, 2016), pp. 1-3, Last paragraph of p. 2, p. 3, Figures 17-22.
Malcolm Johnson et al., "Optical Transport Networks from TDM to packet", ITU-T Manual 2010; ITU-T Draft; Study Period 2009-2012, International Telecommunication Union, Geneva, Switzerland, Feb. 22, 2011, pp. 91-122.
Qiwen Zhong, Huawei Technologies Co., Ltd. China, "Discussion and proposal for G.mtn terminologies regarding Ethernet client signal;WD11-39", ITU-T Draft; Study Period 2017-2020; Study Group 15; Series WD11-39, International Telecommunication Union, Geneva ; CH, Geneva ; CH, (Apr. 1, 2019), vol. 11/15, pp. 1-10, XP044264678.
Qiwen Zhong, Huawei Technologies Co., Ltd. P. R. China, "Analysis for IPG based G.mtn path layer OAM insertion impacton IEEE 802.3 PCS state machine;C1195", ITU-T Draft; Study Period 2017-2020; Study Group 15; Series C1195, International Telecommunication Union, Geneva ; CH, Geneva ; CH, (Jun. 18, 2019), vol. 11/15, pp. 1-6, XP044270155.
Steve Gorshe, Microsemi Corp. U.S.A., "Analysis of the G.mtn A.1 Scope Relative to IEEE 802.3 Clause 82 State Diagrams;C1179", ITU-T Draft; Study Period 2017-2020; Study Group 15; Series C1179, International Telecommunication Union, Geneva ; CH, Geneva ; CH, (Jun. 18, 2019), vol. 11/15, pp. 1-11, XP044270147.
Trowbridge, Steve, "G.mtn Section and Path Overhead Options," ITU-T WD11-10, International Telecommunication Union, Geneva, Switzerland, Apr. 2019.
Ximing Dong CICT P.R. China, "Feasibility Analysis: the Use of Idle as a Resources to Carry Path layer OAM; WD11-16", ITU-T Draft; Study Period 2017-2020; Study Group 15; Series WD11-16, International Telecommunication Union, Geneva ; CH, Geneva ; CH, (Apr. 1, 2019), vol. 11/15, pp. 1-6, XP044264659.
Yang, Jian, Betts, Malkcolm, Gu, Yuan, "SCL OAM solution", ITU-T WD11-65 Submission, International Telecommunication Union, Geneva, Switzerland, Jun. 2018.
Zhang Sen et al., "Hybrid Multiplexing over FlexE Group," 2018 23rd Opto-Electronics and Communications Conference (OECC), IEEE, Jul. 2, 2018, p. 1-2.
"Interfaces for the metro transport network;g8312", ITU-T Draft; Study Period 2017-2020; Study Group 15; Series G8312, International Telecommunication Union, Geneva ; CH vol. 11/15, Nov. 25, 2020 (Nov. 25, 2020), pp. 1-21, XP044302831, Retrieved from the Internet: URL:https://www.itu.int/ifa/t/2017/sg15/exchange/wp3/qll/G.8312/g8312-lcCommentResol utions-v3.docx [retrieved on Nov. 25, 2020].
International Search Report and Written Opinion, PCT/US2022/040258, dated Mar. 28, 2023.

\* cited by examiner 100-1

The one or more operational characteristic signals include two or more operational characteristic signals, and the method includes multiplexing the two or more operational characteristic signals to generate a combined signal indicative of the respective operational characteristics of the crystal oscillator or the oven. The information is generated using the combined signal.

100-2

One or more of the operational characteristic signals are analog signals, and the method includes converting respective ones of the analog operational characteristic signals into a corresponding digitized operational characteristic signal.

100-3

When the operational characteristic signals include one or more analog operational characteristic signals and one or more digital operational characteristic signals, the method includes combining the one or more digitized operational characteristic signals with the one or more digital operational characteristic signals to generate the combined signal. The information is generated using the combined signal.

100-4

The one or more operational characteristic signals are one or more of a temperature signal, a pressure signal, a voltage signal and a current signal.

100-5

The one or more operational characteristic signals include a temperature signal, a pressure signal, and a voltage signal that indicates a voltage level of the oven or the crystal oscillator or a current signal that indicates a current level of the crystal oscillator or the oven.

FIG. 11

METHOD AND APPARATUS FOR CONVEYING CLOCK-RELATED INFORMATION FROM A TIMING DEVICE

CROSS-REFERENCE TO RELATED APPLICATIONS

The present application claims priority to U.S. Provisional Patent Application Ser. No. 63/253,478 filed on Oct. 7, 2021, the contents of which are incorporated by reference herein in their entirety.

BACKGROUND OF THE INVENTION

Temperature-controlled chambers are used in oven-controlled crystal oscillators (OXCOs) to maintain the temperature of the quartz crystal, preventing changes in frequency. Some timing applications require access to information relating to the inner operation of a clock oscillator such as sensor data. For example, timing applications that use holdover algorithms require temperature data relating to the oscillator. To provide the needed sensor data (e.g., temperature), conventional timing devices typically add two or more additional pins to the device, requiring customers to change their designs to accommodate the additional pins. In addition, customers that do not require the sensor data must change their designs to accommodate the added pins even though they do not require sensor data, or move to a different product. It is desirable to be able to manufacture a single device that can accommodate both the needs of the customers that need the sensor data and the customers that are using an existing device footprint that do not need the sensor information.

Many conventional oscillators have a four-pin footprint in which power and ground are received at two pins, the output clock signal is output over a third pin, and in which the fourth pin is unused. It is desirable to be able to use this four-pin footprint and also provide the needed sensor data.

Accordingly, there is a need for a timing device that can transfer sensor data while maintaining compatibility with an existing device footprint. Also, there is a need for a timing device that is inter-operable with systems that do not need the sensor data. Furthermore, there is a need for a four-pin timing device that can transfer both the clock signal and sensor data. The method and apparatus of the present invention provide a solution to the above needs.

SUMMARY OF THE INVENTION

A method is disclosed that includes generating a clock signal at a crystal oscillator disposed in a chamber of an oven, the oven having a heating element to heat the chamber. The method includes generating one or more operational characteristic signals indicative of one or more operational characteristics of the crystal oscillator or the oven. The method includes generating information using the one or more operational characteristic signals, the information indicative of how the generated clock signal is to be modified. The method includes modulating the generated clock signal in relation to the information to generate a modulated clock signal indicative of the one or more operational characteristics of the crystal oscillator or the oven, and outputting the modulated clock signal.

A timing device is disclosed that includes an oven having a chamber, the oven to heat the chamber. A crystal oscillator is disposed in the chamber. The crystal oscillator is to generate a clock signal. One or more sensors generate one or more operational characteristic signals, respective ones of the operational characteristic signals indicative of a respective operational characteristic of the crystal oscillator or the oven. The timing device includes a plurality of input and output (I/O) connections and an integrated circuit (IC) device that is coupled to the I/O connections, the crystal oscillator and the one or more sensors. The IC device includes processing logic coupled to the one or more sensor to receive the one or more operational characteristic signals and generate information that indicates how the generated clock signal is to be modified. The IC device includes a modulator coupled to the processing logic to receive the information and coupled to the crystal oscillator to receive the generated clock signal. The modulator modulates the generated clock signal in relation to the information to generate a modulated clock signal indicative of the one or more operational characteristics of the crystal oscillator or the oven. The modulator is coupled to one or more of the I/O connections. The modulator outputs the modulated clock signal over a single one of the plurality of I/O connections.

The method and apparatus of the present invention can transfer sensor data while maintaining compatibility with an existing device footprint. Also, it is inter-operable with systems that do not need the sensor data, including systems that may be unaware of the modulation of the output clock signal. For example, when the falling edge is of the output clock signal is modulated a system that uses the leading edge of the clock signal can use the method and apparatus without awareness of the method and apparatus of the present invention and without any corresponding software or hardware changes. Since the method and apparatus of the present invention does not require additional connections for transferring sensor data, in one example a four-connection timing device is disclosed that can transfer both the clock signal and sensor data.

BRIEF DESCRIPTION OF THE DRAWINGS

The accompanying drawings are included to provide a further understanding of the invention, and are incorporated in, and constitute a part of, this specification. The drawings illustrate various examples. The drawings referred to in this brief description are not drawn to scale.

FIG. 11 is a diagram showing blocks that can be included in the method of FIG. 10.

DETAILED DESCRIPTION

Figure 1:
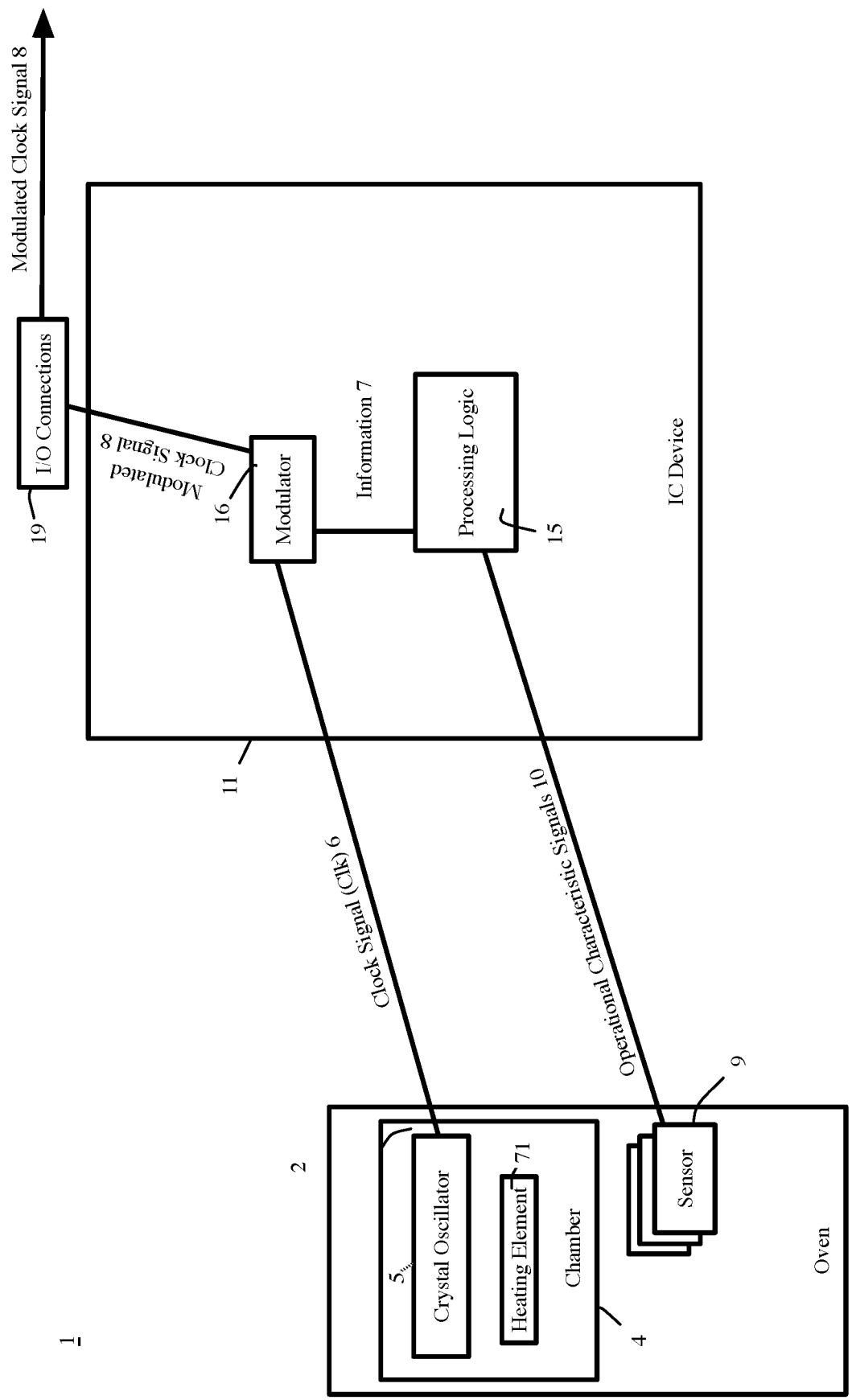
FIG. 1 is a diagram illustrating an example timing device.

FIG. 1 shows a timing device 1 that includes an oven 2 having a chamber 4, a heating element 71 to heat chamber 4, and a crystal oscillator 5 that is disposed in chamber 4 to generate a clock signal (Clk) 6. The timing device may be referred to as an oven-controlled crystal oscillator or "OXCO."

Timing device 1 includes one or more sensors 9 disposed within oven 2 to generate one or more operational characteristic signals 10, respective ones of the one or more operational characteristic signals 10 indicative of an operational characteristics of crystal oscillator 5 or oven 2. The term "operational characteristic signal," as used in the present application is a signal that indicates an operational characteristic of the crystal oscillator or the oven, and can be a digital operational characteristic signal or an analog operational characteristic signal.

Timing device 1 includes a plurality of I/O connections 19 and an IC device 11 coupled to I/O connections 19, the crystal oscillator 5 and the one or more sensors 9. As indicated above, the term "connections" as used herein is meant to include all input/output connections of timing device 1, such as ball grid arrays, pins and leads, without limitation. IC device 11 includes processing logic 15, coupled to the one or more sensor 9. Processing logic 15 receives the generated one or more operational characteristic signals 10 and generates information 7 using the one or more operational characteristic signals 10, the information 7 indicating how the generated clock signal 6 is to be modified. IC device 11 includes a modulator 16 coupled to processing logic 15 and the crystal oscillator 5 to receive the generated clock signal 6 and the information 7. Modulator 16 modulates clock signal 6 in relation to information 7 to generate a modulated clock signal 8 indicative of the one or more operational characteristics of crystal oscillator 5 or oven 2. In one example modulator 16 changes the pulse width of respective ones of clock signals 6 so as to adjust the falling edge of the clock signal while not changing the leading edge of the clock signal. Alternatively, the pulse width of respective ones of clock signals 6 are changed to adjust the leading edge of the clock signal while not changing the falling edge of the clock signal.

In one example, the modulation changes the duty cycle of the clock, which only affects the falling edge of the modulated clock signal 8. Accordingly, for customers using the leading edge of timing device 1 for timing, that don't need the modulated information, there is no impact as compared to a conventional timing device. In one example, a 25% duty cycle is used for sending a '0,' a 50% duty cycle is used for sending a '1' and a 75% duty cycle is used to indicate the start of a data frame. In one example, timing device 1 is programmable to use either leading edge or trailing edge modulation. In this example modulator 16 includes logic that can perform either leading edge or trailing edge modulation and the logic of modulator 16 can switch between leading edge and trailing edge modulation. Alternatively, modulator 16 includes logic that either performs leading edge or trailing edge modulation and users can switch between leading edge and trailing edge modulation by selecting a timing device 1 that performs the desired type of modulation.

Modulator 16 is coupled to one or more of I/O connections 19 and outputs the modulated clock signal 8 over a single one of I/O connections 19.

In one example, timing device 1 includes a single (one) sensor 9 to generate one operational characteristic signal 10 indicative of one operational characteristic of crystal oscillator 5 or oven 2. In this example processing logic 15 receives the one operational characteristic signal 10 and uses the one operational characteristic signal 10 to generate information 7.

The operational characteristic signal 10 generated by a respective sensor 9 can be an analog signal or a digital signal. In one example the one or more operational characteristic signals 10 in FIG. 1 are respective digital signals.

Figure 2:
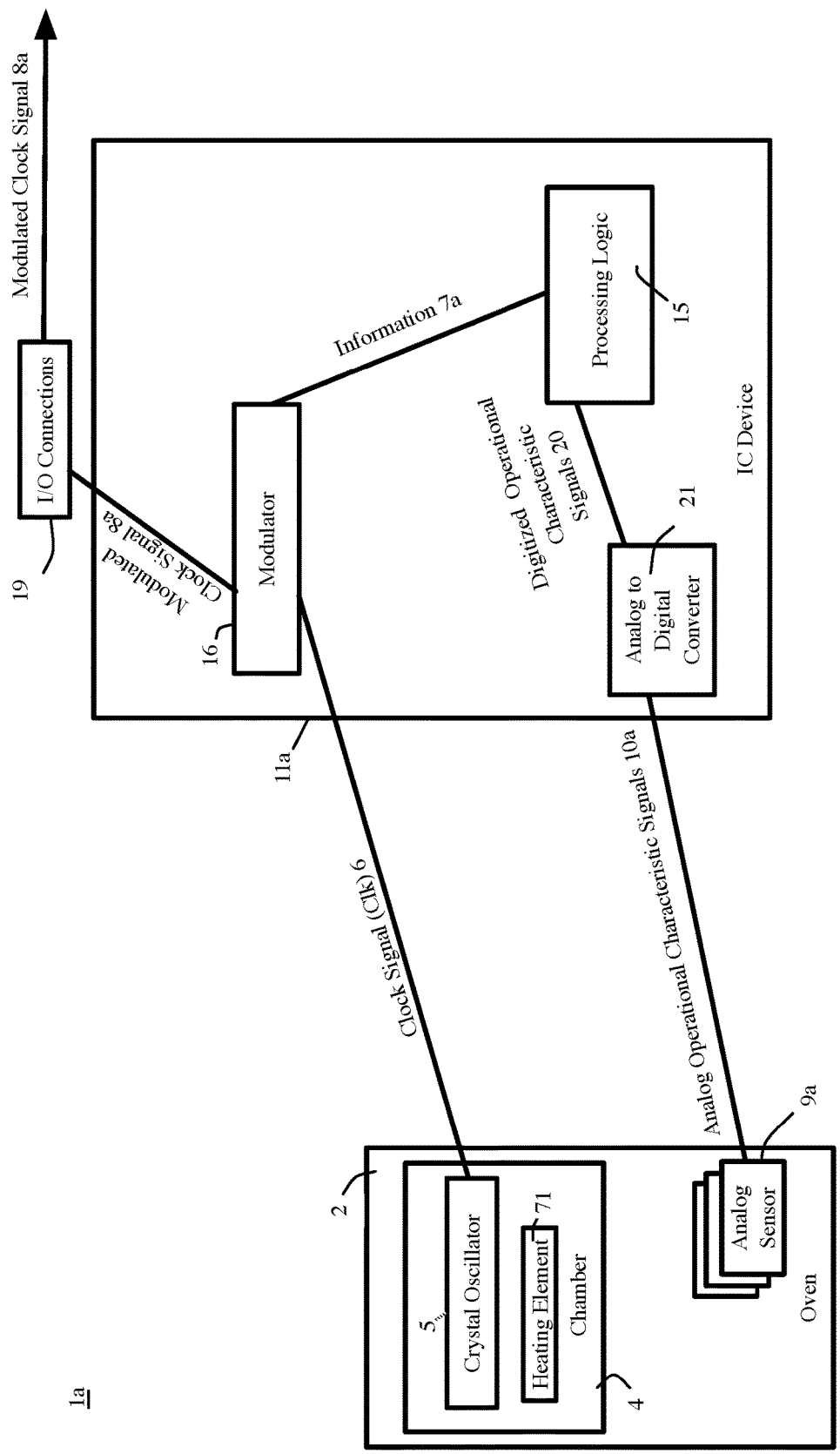
FIG. 2 is a diagram showing an example timing device that includes one or more sensor that generates one or more analog operational characteristic signals and that includes an analog to digital converter.

FIG. 2 illustrates an example of a timing device 1a which is similar to timing device 1, as described above, except as indicated below. Timing device 1a includes one or more analog sensors 9a that generate analog output. In this example, analog sensors 9a generate one or more analog operational characteristic signals 10a indicative of an operational characteristics of crystal oscillator 5 or oven 2. IC device 11a includes modulator 16 that is coupled to crystal oscillator 5 to receive the generated clock signal 6, processing logic 15 and analog to digital converter 21. Analog to digital converter 21 is coupled to analog sensor 9a to receive the generated one or more analog operational characteristic signals 10a, and to processing logic 15. Analog to digital converter 21 converts respective ones of the one or more analog operational characteristic signals 10a into a corresponding digitized operational characteristic signal 20 that is indicative of the respective operational characteristic of crystal oscillator 5 or oven 2. Analog to digital converter 22 outputs the one or more digitized operational characteristic signals 20. Processing logic 15 receives the one or more digitized operational characteristic signals 20 and uses the one or more digitized operational characteristic signals 20 to generate information 7a that indicates how the generated clock signal is to be modified.

Oven 2, chamber 4, heating element 71, crystal oscillator 5, plurality of I/O connections 19, modulator 16 and I/O connections 19 in FIG. 2 are coupled together and operate in the same manner as discussed with regard to FIG. 1. In the example shown in FIG. 2, modulator 16 receives generated clock signal 6 and information 7a; and modulates the generated clock signal 6 in relation to the information 7a to generate a modulated clock signal 8a indicative of the one or more operational characteristics of crystal oscillator 5 or oven 2. Modulator 16 outputs the modulated clock signal 8a over a single one of the I/O connections 19.

In one example, timing device 1a includes a single (one) analog sensor 9a to generate one analog operational characteristic signal 10a indicative of one operational characteristic of crystal oscillator 5 or oven 2. In this example analog to digital converter 21 converts the one analog operational characteristic signal 10a into one digitized operational characteristic signal 20 and processing logic 15 receives the one digitized operational characteristic signal 20 and uses the one digitized operational characteristic signal 20 to generate information 7a.

Figure 3:
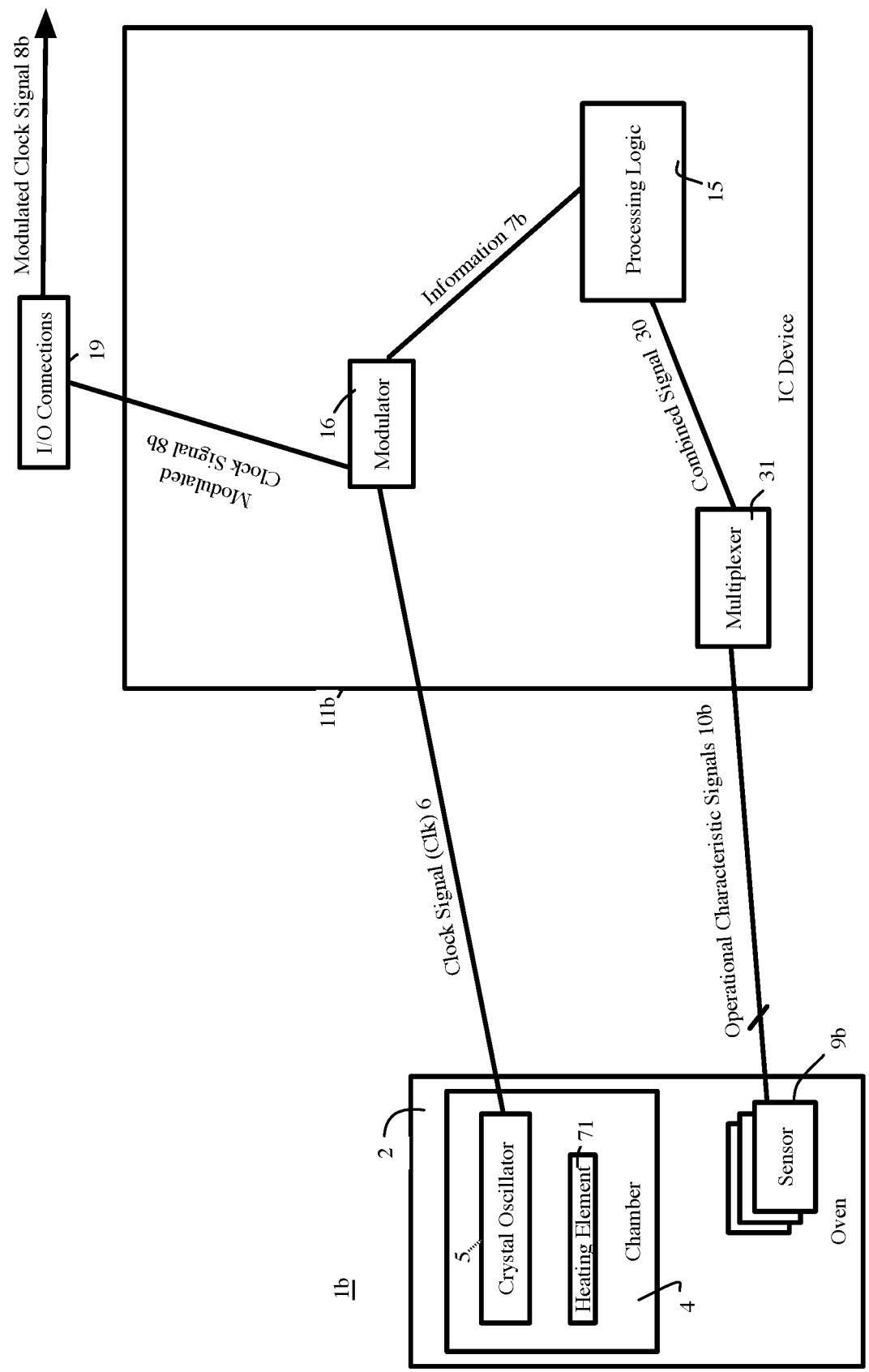
FIG. 3 is diagram showing an example timing device that includes two or more sensors and a multiplexer.

FIG. 3 shows a timing device 1b, which is similar to timing device 1, as described above, except as indicated below. Timing device 1b includes two or more sensors 9b disposed within oven 2 to generate two or more operational characteristic signals 10b, respective ones of the two or more operational characteristic signals 10b indicative of an operational characteristics of crystal oscillator 5 or oven 2. Timing device 1b includes an IC device 11b that includes modulator 16, processing logic 15 and multiplexer 31. Multiplexer 31 is coupled to the two or more sensors 9b to receive respective ones of the generated two or more operational characteristic signals 10b, and multiplexes respective ones of the two or more operational characteristic signals 10b to generate a combined signal 30 indicative of the respective operational characteristics of crystal oscillator 5 or oven 2. Processing logic 15 receives combined signal 30 and uses the combined signal 30 to generate information 7b that indicates how the generated clock signal 6 is to be modified. Modulator 16 is coupled to processing logic 15 to received generated information 7b, and is coupled to crystal oscillator 5 to receive the generated clock signal. Modulator 16 modulates the generated clock signal 6 in relation to the information 7b to generate a modulated clock signal 8b indicative of the operational characteristics of crystal oscillator 5 or oven 2. Modulator 16 is coupled to one or more of the I/O connections 19 to output modulated clock signal 8b over a single one of I/O connections 19.

In one example pulse amplitude modulation (PAM) is used for modulation in which modulator 16 is a pulse amplitude modulator, processing logic 15 generates information 7-7b indicating how the generated clock signal 6 is to be modified. Modulator 16 modulates the generated clock signal 6 in relation to the received information 7-7b to generate modulated clock signal 8-8b having a pulse amplitude indicative of the operational characteristics of crystal oscillator 5 or oven 2. In one example in which PAM is used the amplitude of the clock signal is within a first predetermined range to indicate a "1" and within a second predetermined range to indicate a "0."

In another example pulse width modulation (PWM) is used for modulation in which modulator 16 is a pulse width modulator, processing logic 15 generates information 7-7b indicating how the generated clock signal 6 is to be modified. Modulator 16 modulates the generated clock signal 6 in relation to the received information 7-7b to generate modulated clock signal 8-8b indicative of the operational characteristics of crystal oscillator 5 or oven 2.

In another example information 7-7b represents a pulse-code modulated (PCM) signal that indicates the amplitude of one or more analog signal output from one or more sensor 9-9b. In this example, modulator 16 performs PCM corresponding to information 7-7b to generate a modulated clock signal 8-8b in which the width of the pulses indicate the relative height of the analog signal output from the one or more analog sensor 9-9b.

In further examples, the modulation can be pulse position modulation (PPM) or pulse duration modulation (PDM) corresponding to information 7-7b to generate a modulated clock signal 8-8b in which the width of the pulses or duration of the pulses indicate the signal output from the one or more sensors 9-9b.

Figure 4:
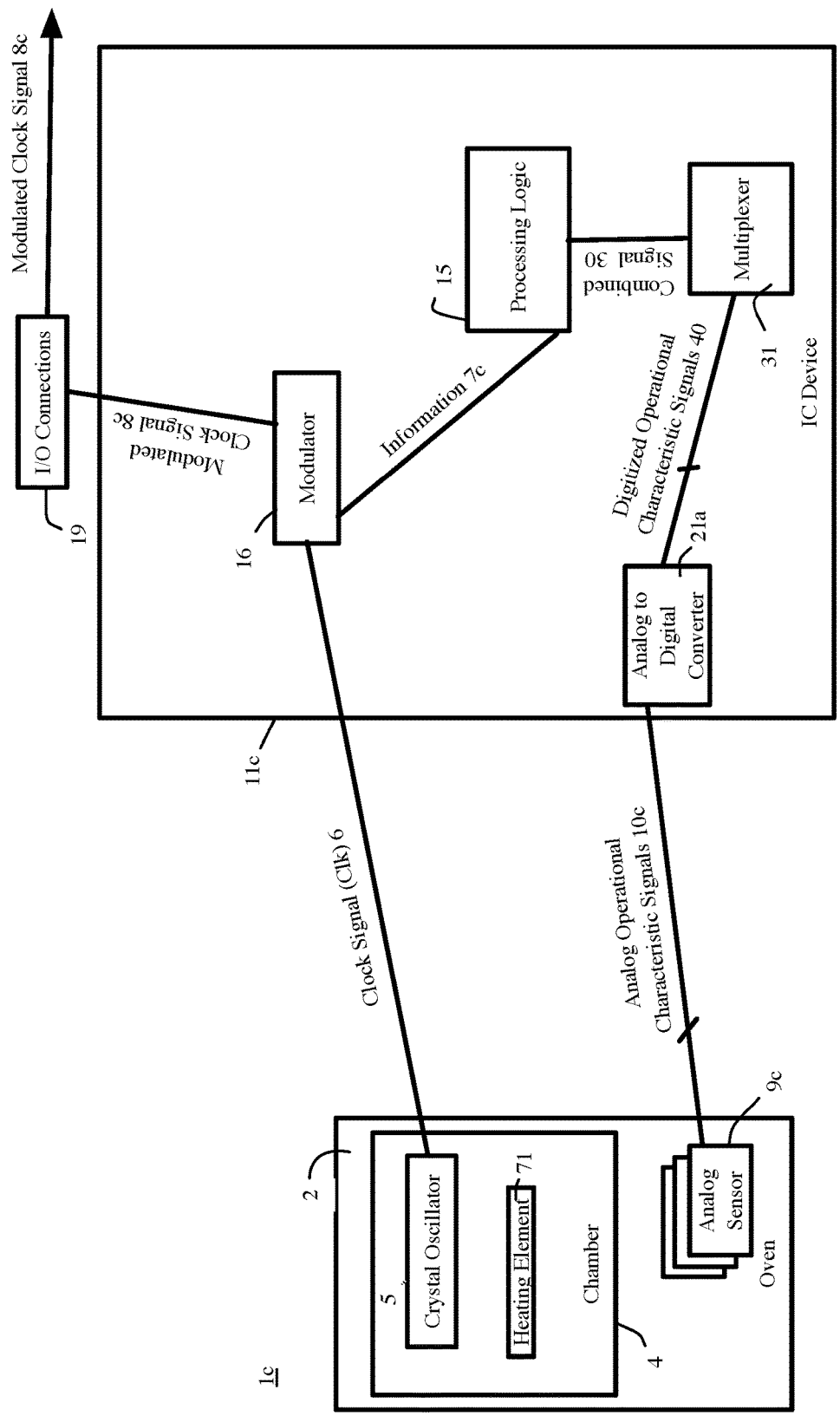
FIG. 4 is a diagram showing an example timing device that includes one or more sensor that generates one or more analog operational characteristic signals and that includes an analog to digital converter.

FIG. 4 shows a timing device 1c, which is similar to timing device 1, as described above, except as indicated below. Timing device 1c includes two or more analog sensors 9c disposed within oven 2 that generate analog output and an IC device 11c. Sensors 9c generate analog operational characteristic signals 10c that are indicative of respective operational characteristic of the crystal oscillator 5 or the oven 2. IC device 11c includes modulator 16, processing logic 15, multiplexer 31, analog to digital converter 21a. Analog to digital converter 21a has inputs coupled to two or more of the two or more sensors 9c to receive the generated analog operational characteristic signals 10c and has outputs coupled to inputs of multiplexer 31. Analog to digital converter 21a converts respective ones of the two or more analog operational characteristic signals 10c into a corresponding one of digitized operational characteristic signals 40 indicative of the respective operational characteristic of crystal oscillator 5 or oven 2. Multiplexer 31 multiplexes respective ones of the two or more digitized operational characteristic signals 40 to generate combined signal 30. processing logic 15 is coupled to an output of multiplexer 31. processing logic 15 receives combined signal 30 and uses combined signal 30 to generate information 7c that indicates how the generated clock signal 6 is to be modified. Modulator 16 is coupled to processing logic 15 to receive information 7c and is coupled to crystal oscillator 5 to receive generated clock signal 6, and modulates the generated clock signal 6 in relation to the information 7c to generate a modulated clock signal 8c indicative of the operational characteristics of crystal oscillator 5 or oven 2. Modulator 16 is coupled to one or more of I/O connections 19 to output modulated clock signal 8c over a single one of I/O connections 19.

Figure 5:
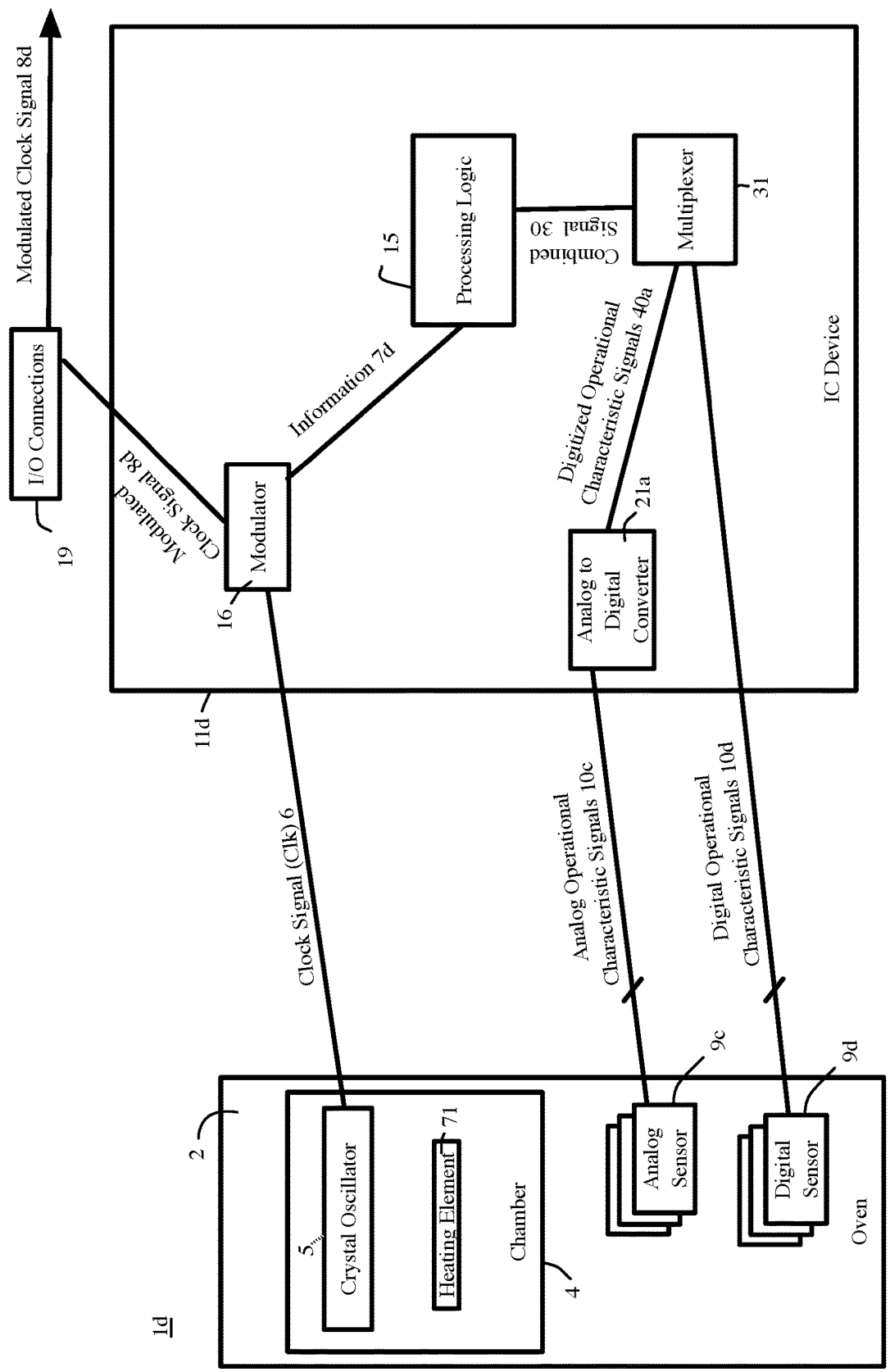
FIG. 5 is a diagram showing an example timing device that includes one or more sensor that generates analog operational characteristic signals and one or more sensor that generates digital operational characteristic signals.

FIG. 5 shows a timing device 1d which is similar to timing device 1, as described above, except as indicated below. Timing device 1d includes one or more analog sensors 9c disposed within oven 2 that generate analog output and one or more digital sensors 9d disposed within oven 2 that generate digital output. Analog sensors 9c generate one or more analog operational characteristic signals 10c that are indicative of a respective operational characteristic of crystal oscillator 5 or oven 2, and digital sensors 9d generate one or more digital operational characteristic signals 10d that are indicative of a respective operational characteristic of crystal oscillator 5 or oven 2. IC device 11d includes modulator 16, processing logic 15, multiplexer 31 and analog to digital converter 21a. Analog to digital converter 21a has inputs coupled to respective outputs of analog sensors 9c and an output coupled to an input of multiplexer 31. Analog to digital converter 21a converts respective ones of the one or more analog operational characteristic signals 10c into a digitized operational characteristic signal 40a indicative of a respective operational characteristic of the crystal oscillator 5 or the oven 2. In one example there are a plurality of analog operational characteristic signals 10c and analog to digital converter 21a converts each of the analog operational characteristic signals into a corresponding digitized operational characteristic signal, and analog to digital converter 21a multiplexes the digitized operational characteristic signals into a single signal (digitized operational characteristic signal 40a) that is output to multiplexer 31.

The one or more digital sensors 9d are coupled to respective inputs of multiplexer 31. Multiplexer 31 multiplexes the one or more digital operational characteristic signals 10d with the digitized operational characteristic signal 40a to obtain combined signal 30. Processing logic 15 uses combined signal 30 to generate information 7d that indicates how the distributed generated clock signal 6 is to be modified. Modulator 16 is coupled to processing logic 15 to receive generated information 7d, and is coupled to crystal oscillator 5 to receive the generated clock signal 6. Modulator 16 modulates generated clock signal 6 in relation to information 7d to generate a modulated clock signal 8d indicative of the operational characteristics of crystal oscillator 5 or oven 2. Modulator 16 is coupled to one or more of I/O connections 19 to output modulated clock signal 8d over a single one of I/O connections 19.

Figure 6A:
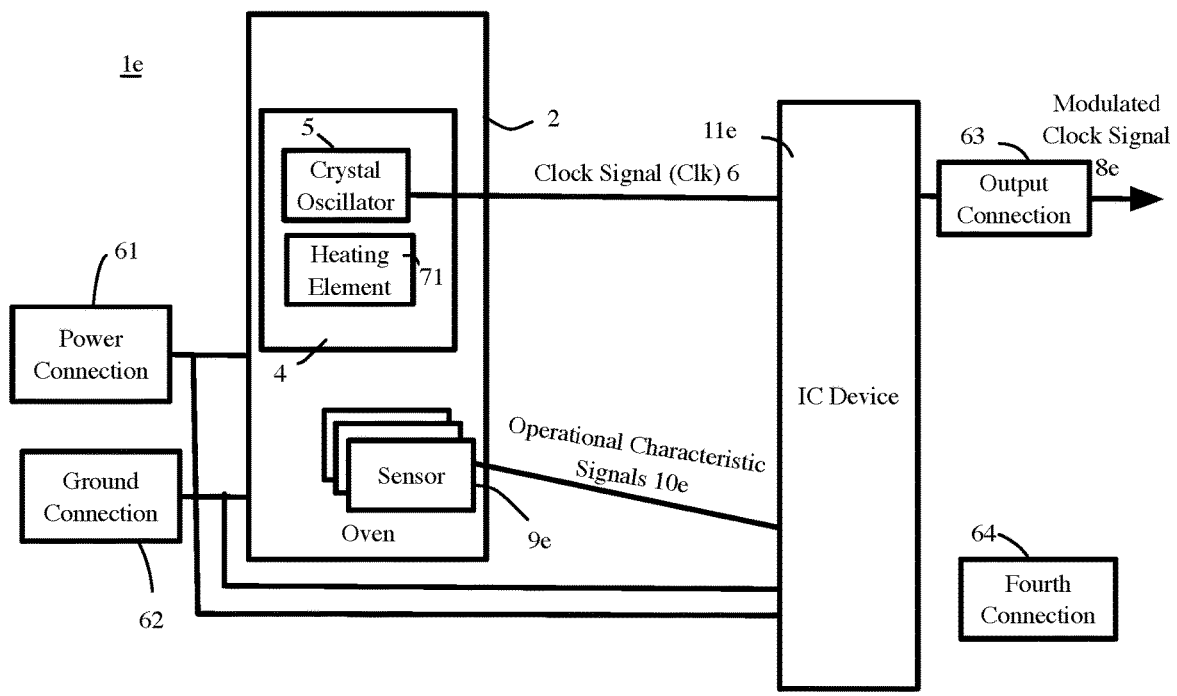
FIG. 6A is a diagram illustrating an example timing device having four connections, where one of the four connections is not electrically coupled to the IC device.
Figure 6B:
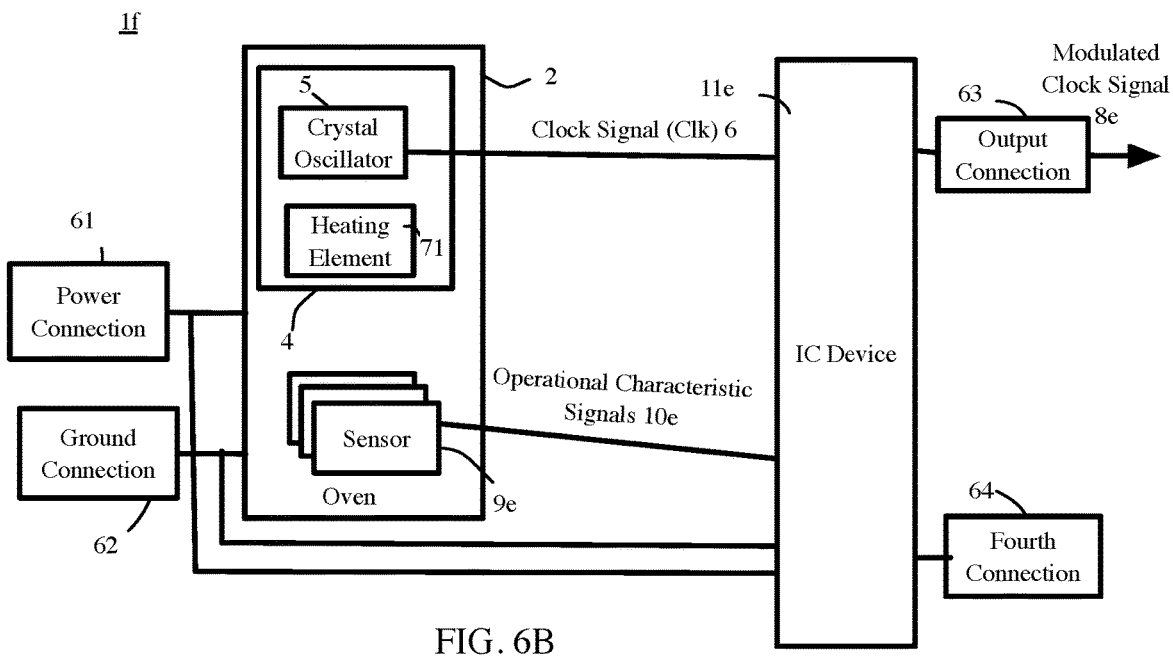
FIG. 6B is a diagram illustrating an example timing device having four connections that are electrically coupled to the IC device.

In one example that is shown in FIG. 6A a timing device 1e is shown in which the plurality of I/O connections 19 consist of four connections, a power connection 61 to couple power to the components of timing device 1e, a ground connection 62 to couple ground to the components of timing device 1e, an output connection 63 and a fourth connection 64. In the example shown in FIG. 6A fourth connection 64 is not electrically coupled to IC device 11e and is not used. FIG. 6B shows an example of a timing device 1f, that is the same as timing device 1e shown in FIG. 6A, except that fourth connection 64 is coupled to IC device 11e and may be used for some purpose.

In one example of FIGS. 6A-6B, power connection 61 and ground connection 62 are coupled to oven 2 and IC device 11e. Output connection 63 is coupled to modulator 16 of IC device 11e to output modulated clock signal 8e. Timing device 1e, sensors 9e and IC device 1e may be coupled in the same way and operate in the same manner as any one of timing devices 1-1d, sensors 9-9d and IC devices 1-1d, and the components thereof shown in previous FIGS. 1-5.

Figure 7A:
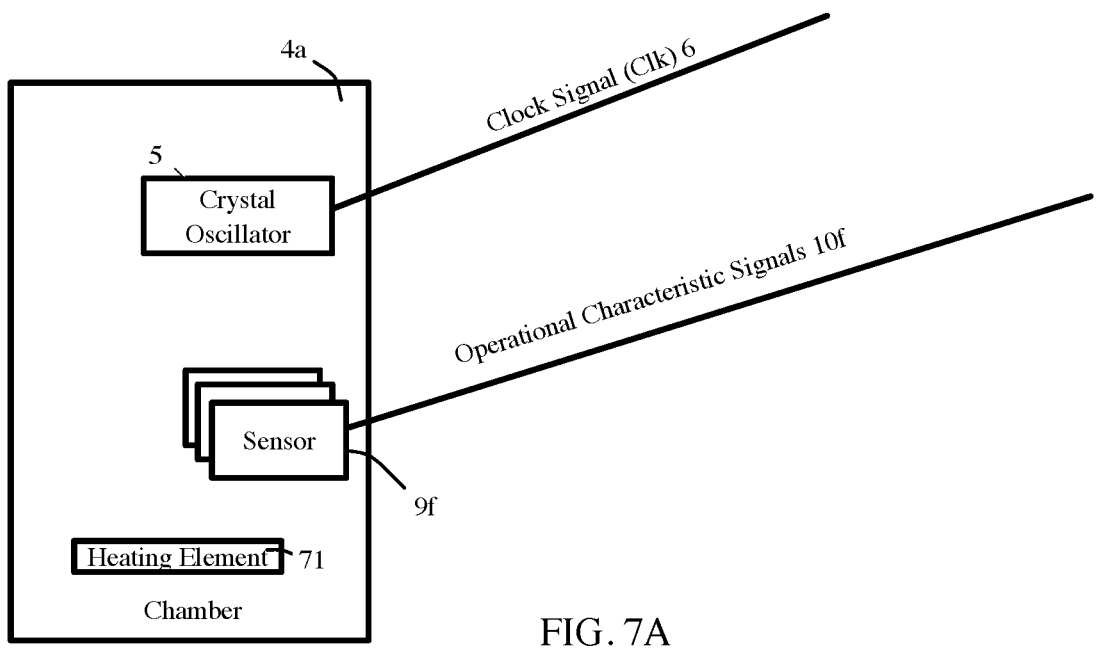
FIG. 7A is a diagram illustrating that one or more of the sensors can be located within the chamber.

In one example, some or all of sensors 9-9e are disposed in chamber 4. FIG. 7A shows an example of a chamber 4a in which one or more sensors 9f are disposed. Sensors 9f generate operational characteristic signals 10f. In this example, chamber 4a and heating element 71 may be coupled in the same manner and may operate in the same manner as chamber 4 and heating element 71 shown in FIGS. 1-6B. Sensor 9f may be coupled in the same manner, and may operate in the same manner as any of sensors 9-9e shown in FIGS. 1-6B.

Figure 7B:
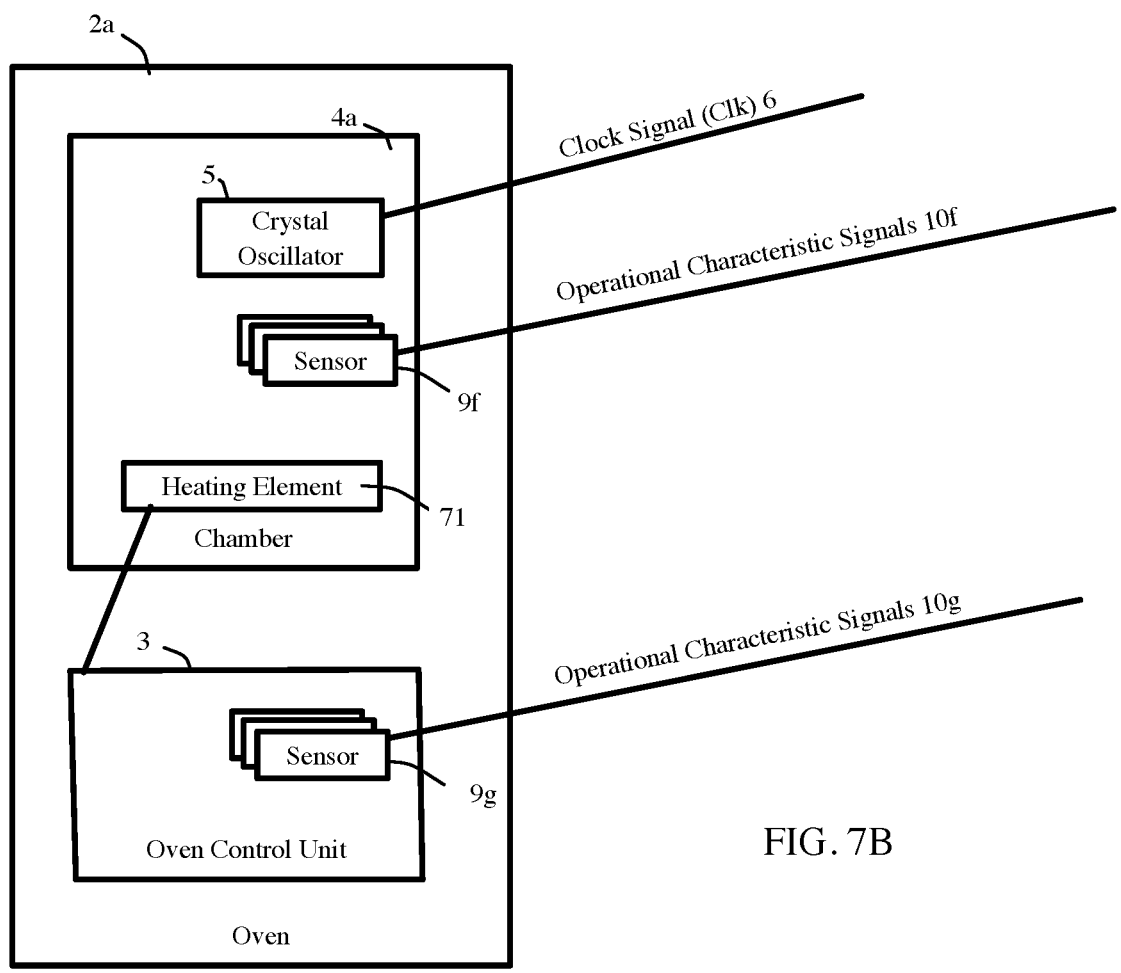
FIG. 7B is a diagram illustrating an oven that includes an oven-control unit, that illustrates that one or more of the sensors can be located within the oven control unit.

FIG. 7B shows an example of an oven 2a that includes an oven control unit 3 and in which one or more sensors 9g that generate operational characteristic signals 10g are disposed in oven control unit 3. In this example, oven 2 includes a heating element 71 that is disposed inside chamber 4 and that is coupled to oven control unit 3. Alternatively, heating element 71 is disposed outside of chamber 4 and is thermally coupled to chamber 4. Oven control unit 3 controls the operation of heating element 71 to control the temperature of chamber 4. Oven 2a may be coupled in the same manner and may operate in the same manner as oven 2 in any of FIGS. 1-6B. The one or more sensors 9g may be coupled in the same manner, and may operate in the same manner as any of sensors 9-9e shown in FIGS. 1-6B. In one example the one or more sensors 9g are integrated with the electronics of control unit 3, and may be, for example a voltage sensing circuit or a current sensing circuit, without limitation.

Figure 8:
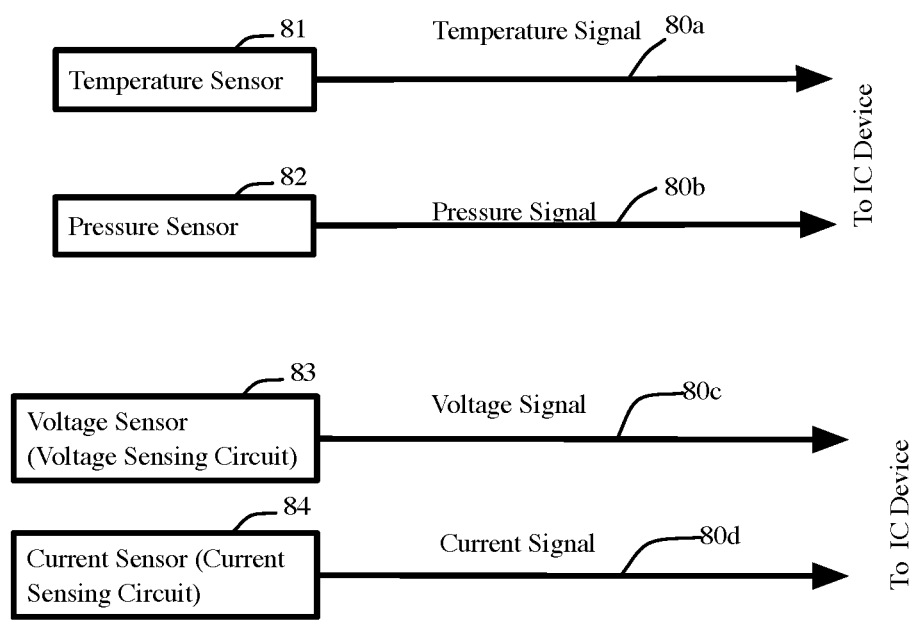
FIG. 8 is a diagram illustrating examples of sensors and the operational characteristic signals generated by the sensors.

FIG. 8 illustrates various examples of sensors 81-84 and respective operational characteristic signals 80a-80d. Sensors 9-9g in FIGS. 1-7B can be one or more of any of sensors 81-84 and operational characteristic signals 10-10g in FIGS. 1-7B can be one or more of any of operational characteristic signals 80a-80d, without limitation. In the example shown in FIG. 8, temperature sensor 81 senses a temperature relating to crystal oscillator 5 and generates a temperature signal 80a that is output to one of IC devices 11-11e that is indicative of the temperature of crystal oscillator 5. In one example temperature sensor 81 is disposed within chamber 4-4a for sensing the temperature inside chamber 4-4a that is indicative of the temperature of crystal oscillator 5.

Pressure sensor 82 senses a pressure relating to crystal oscillator 5 and generates a pressure signal 80b that is output to one of IC devices 11-11e that is indicative of the pressure of crystal oscillator 5. In one example temperature sensor 82 is disposed within chamber 4-4a for sensing the pressure inside chamber 4-4a that is indicative of the pressure of crystal oscillator 5.

Voltage sensor 83 senses a voltage relating to crystal oscillator 5 and generates a voltage signal 80c that is output to one of IC devices 11-11e that is indicative of the voltage of crystal oscillator 5. In one example voltage sensor 83 is a voltage sensing circuit that is coupled to crystal oscillator 5 for sensing the voltage being applied to crystal oscillator 5. Alternatively, voltage sensor 83 can sense a voltage relating to oven 2.

Current sensor 84 senses a current relating to crystal oscillator 5 and generates a current signal 80d that is output to one of IC devices 11-11e that is indicative of the current of crystal oscillator 5. In one example current sensor 84 is a current sensing circuit that is coupled to crystal oscillator 5 for sensing the current being applied to crystal oscillator 5. Alternatively, current sensor 84 can sense a current relating to oven 2.

FIGS. 9A-9D illustrate various examples, without limitation. The features shown in FIGS. 9A-9D may be coupled to the other components of a timing device 1-1f, and may operate in the same manner as the examples shown in FIGS. 1-8. In the example shown in FIG. 9A, chamber 4b contains heating element 71, crystal oscillator 5 to generate a clock signal 6, temperature sensor 81 to generate a temperature signal 80a that indicates the temperature within chamber 4b, pressure sensor 82 to generate a pressure signal 80b that indicates the pressure within chamber 4b and thus experienced by crystal oscillator 5. Voltage sensor 83 that generates a voltage signal 80c and current sensor 84 that generates a current signal 80d are disposed in oven 2b. In this example the modulated clock signal (e.g., one of modulated clock signals 8-8e) is indicative of the temperature and the pressure of crystal oscillator 5, a voltage relating to crystal oscillator 5 or oven 2b and a current relating to crystal oscillator 5 or oven 2b.

Figure 9A:
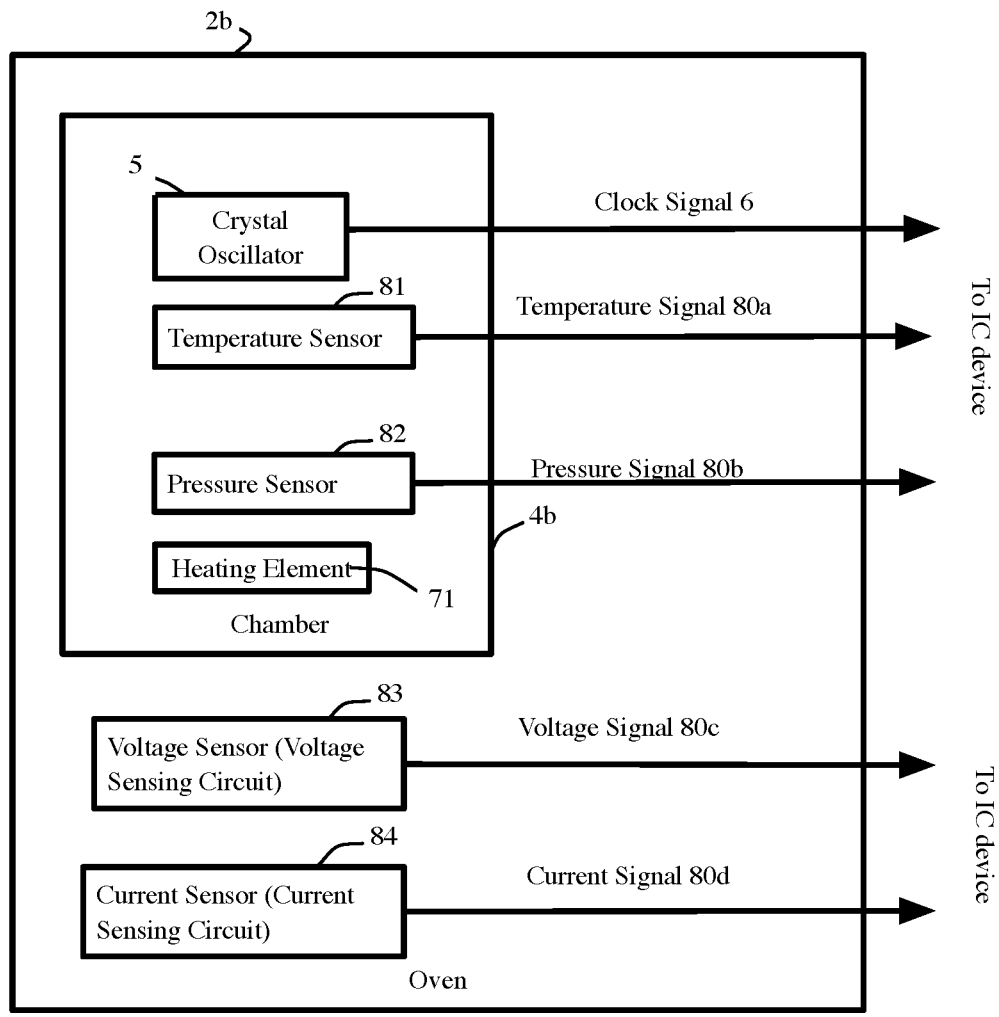
FIG. 9A-9D show examples of ovens that illustrate various combinations of sensors and operational characteristic signals.
Figure 9B:
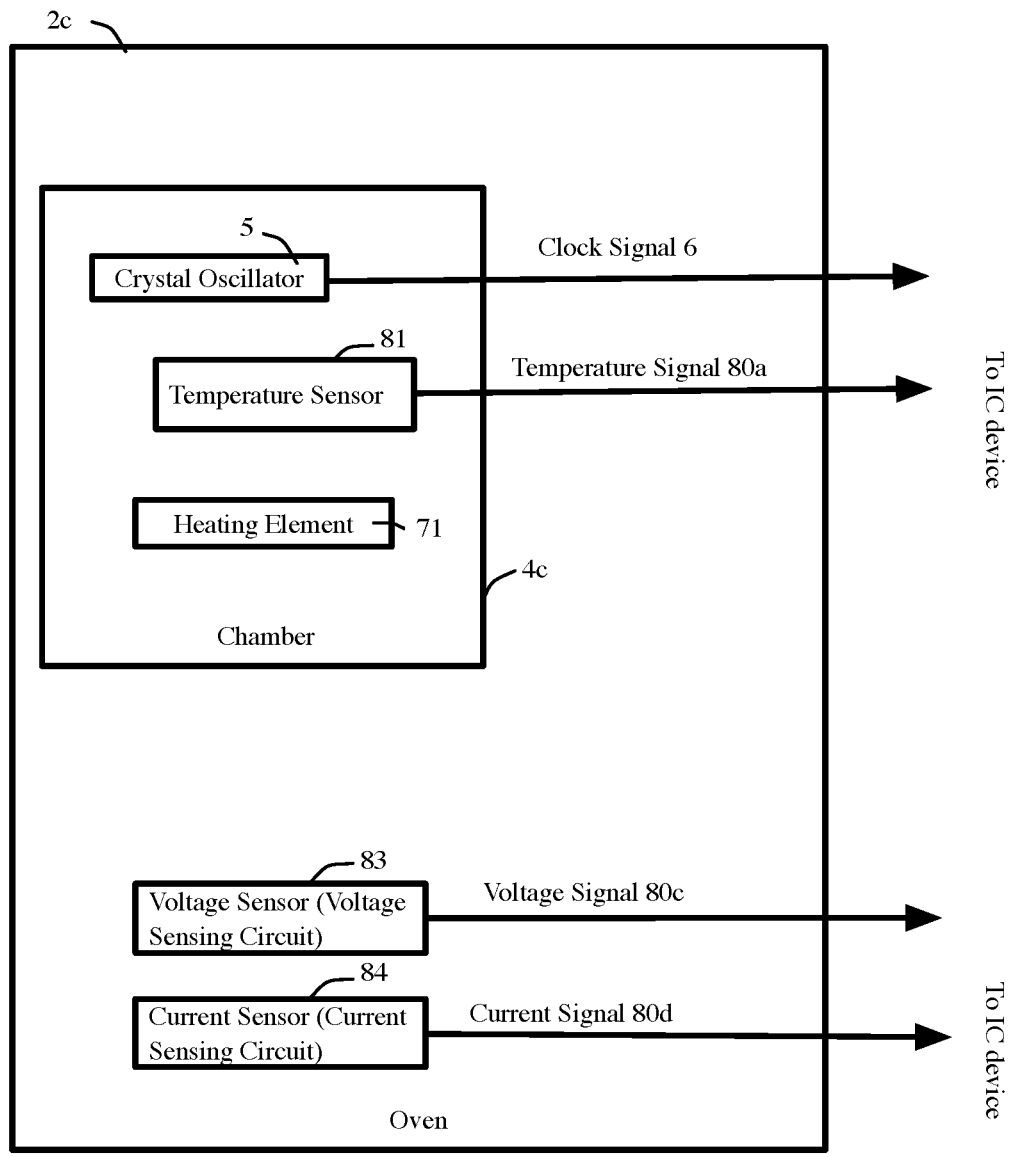

FIG. 9B shows an example in which voltage sensor 83 and current sensor 84 are disposed in oven 2c; and in which crystal oscillator 5, heating element 71 and temperature sensor 81 are located in chamber 4c. In this example the modulated clock signal (e.g., one of modulated clock signals 8-8e) is indicative of the temperature of crystal oscillator 5, a voltage relating to crystal oscillator 5 or oven 2c, and a current relating to crystal oscillator 5 or oven 2c.

Figure 9C:
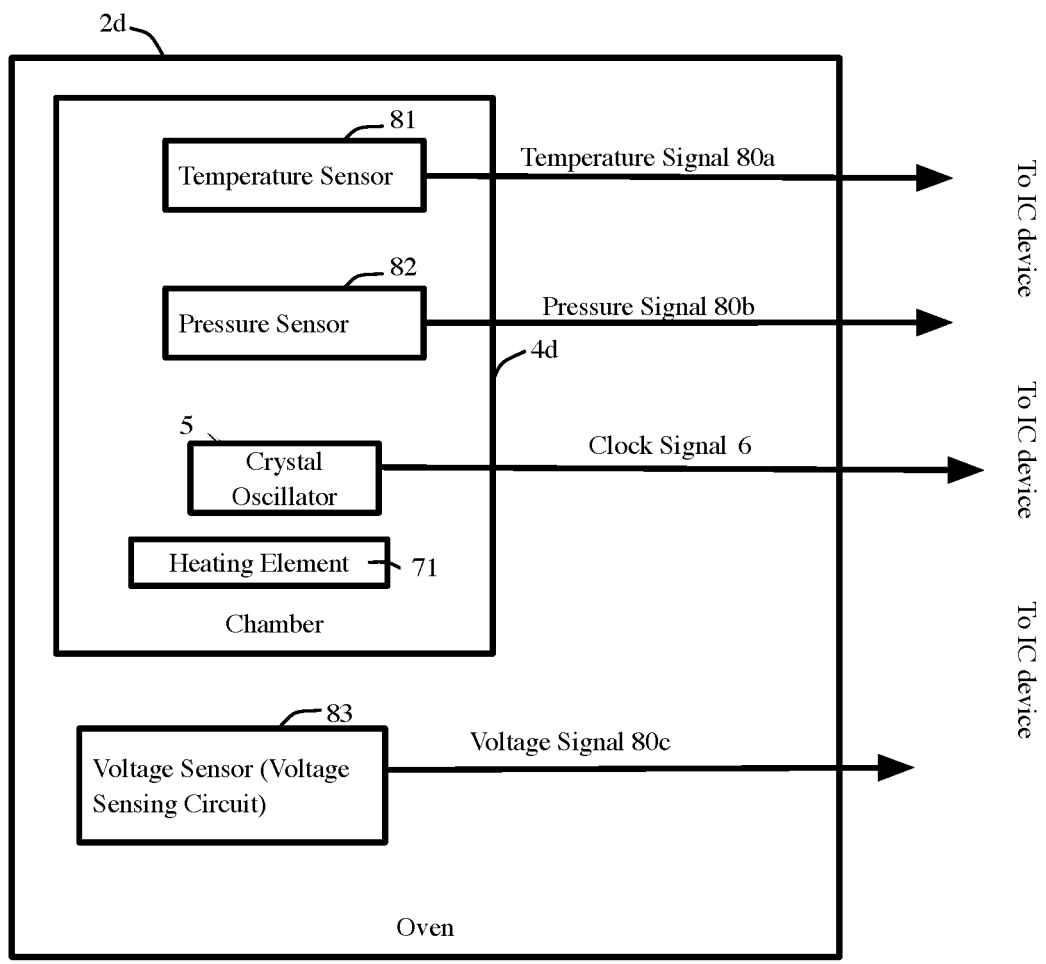

FIG. 9C shows an example in which voltage sensor 83 is disposed in oven 2d; and in which crystal oscillator 5, heating element 71, temperature sensor 81 and pressure sensor 82 are located in chamber 4d. In this example modulated clock signal (e.g., one of modulated clock signals 8-8e) is indicative of the temperature and the pressure of crystal oscillator 5, and a voltage relating to crystal oscillator 5 or oven 2d.

Figure 9D:
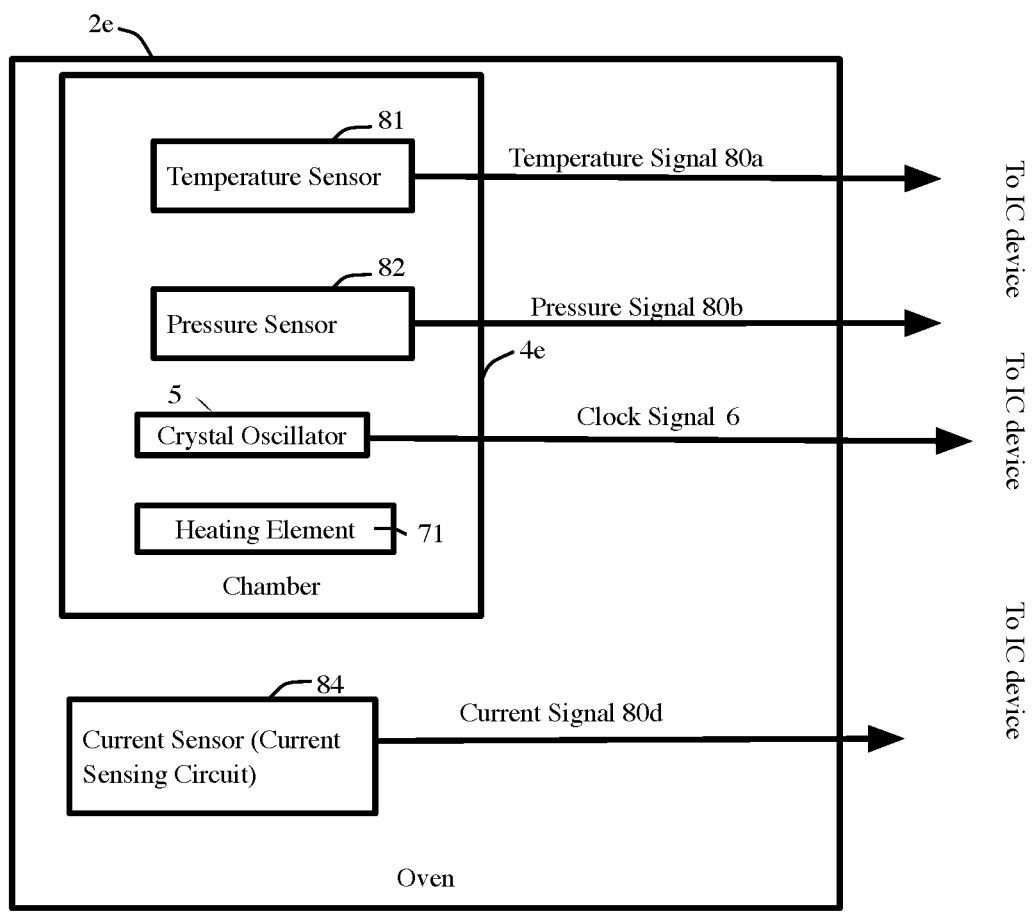

FIG. 9D shows an example in which current sensor 84 is disposed in oven 2e; and in which crystal oscillator 5, heating element 71, temperature sensor 81 and pressure sensor 82 are located in chamber 4e. In this example modulated clock signal (e.g., one of modulated clock signals 8-8e) is indicative of the temperature and the pressure of crystal oscillator 5, and a current relating to crystal oscillator 5 or oven 2e.

Figure 10:
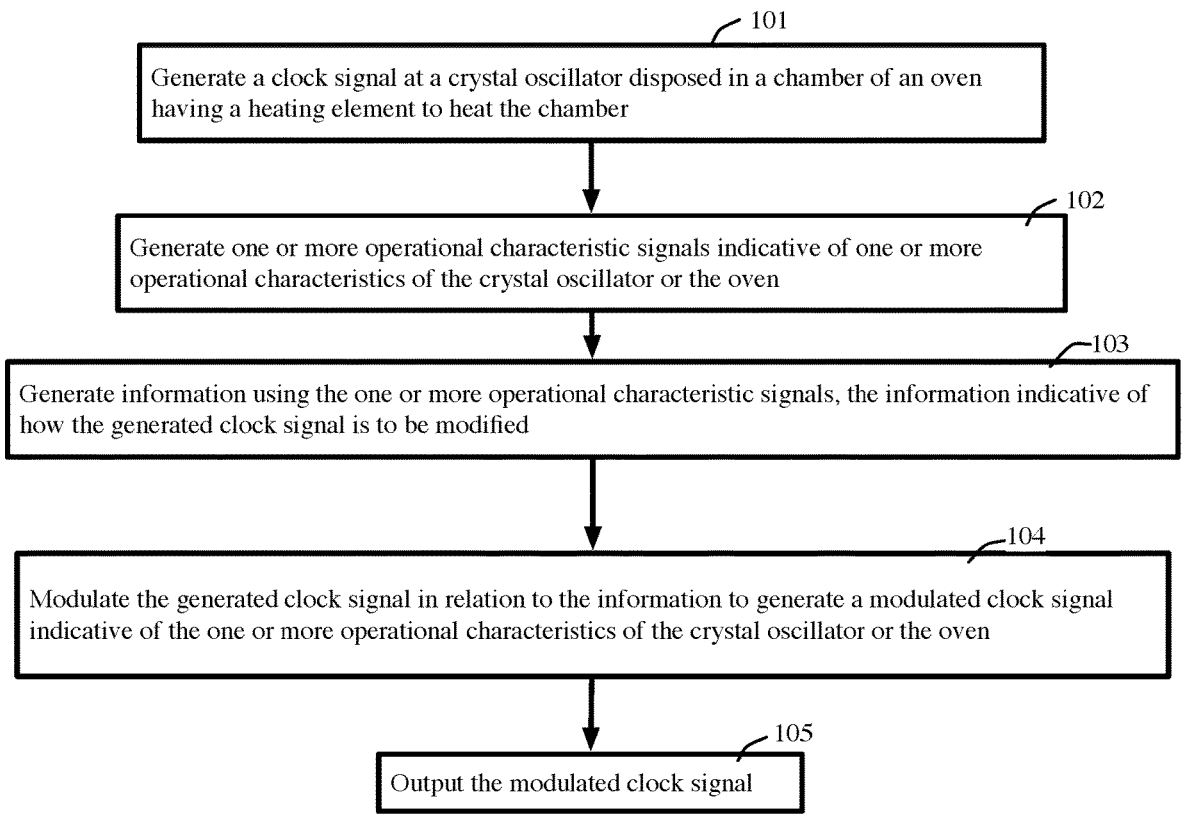
FIG. 10 is a flow diagram showing a method for conveying clock-related information from a timing device.

FIG. 10 illustrates a method 100 that includes generating (101) a clock signal at a crystal oscillator disposed in a chamber of an oven having a heating element to heat the chamber. The method includes generating (102) one or more operational characteristic signals indicative of one or more operational characteristics of the crystal oscillator or the oven. The method includes generating (103) information using the one or more operational characteristic signals, the information indicative of how the generated clock signal is to be modified. The method includes modulating (104) the generated clock signal in relation to the information to generate a modulated clock signal indicative of the one or more operational characteristics of the crystal oscillator or the oven; and outputting (105) the modulated clock signal.

In one example shown in block 100-1 the one or more operational characteristic signals include two or more operational characteristic signals, and the method includes multiplexing the two or more operational characteristic signals to generate a combined signal indicative of the respective operational characteristics of the crystal oscillator or the oven. In this example the information is generated using the combined signal.

In one example shown in block 100-2 the one or more operational characteristic signals are analog operational characteristic signals, the method includes converting respective ones of the analog operational characteristic signals into a corresponding digitized operational characteristic signal.

In one example shown in block 100-3, when the one or more operational characteristic signals include one or more analog operational characteristic signals and one or more digital operational characteristic signals, the method includes combining the one or more digitized operational characteristic signals with the one or more digital signals to generate a combined signal prior to generating the information. In this example the information is generated using the combined signal.

In one example shown in block 100-4, the one or more operational characteristic signals are one or more of a temperature signal, a pressure signal, a voltage signal and a current signal.

In one example shown in block 100-5, the one or more operational characteristic signals include a temperature signal, a pressure signal, and a voltage signal that indicates a voltage level of the oven or the crystal oscillator or a current signal that indicates a current level of the oven or the crystal oscillator.

Figure 12:
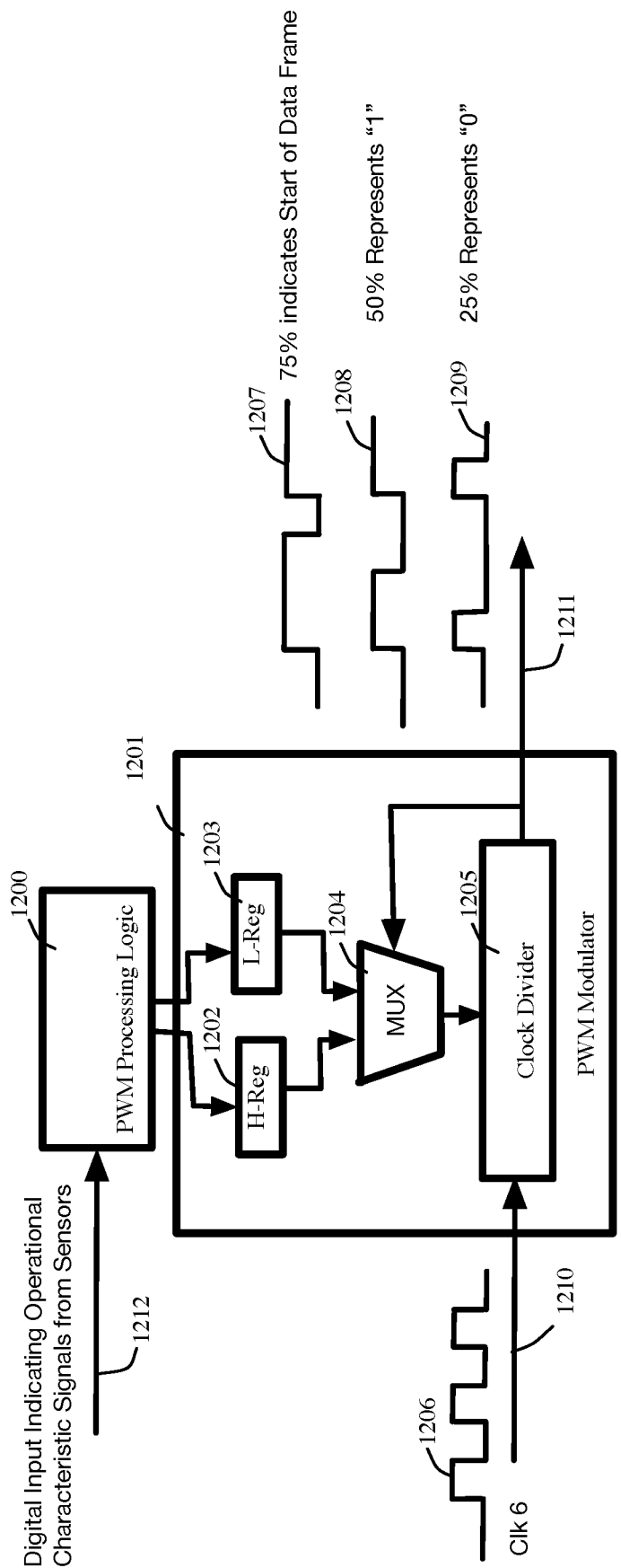
FIG. 12 shows an example that uses pulse wave modulation.

FIG. 12 shows an example in which processing logic 15 comprises PWM processing logic 1200 and modulator 16 comprises PWM modulator 1201. PWM processing logic 1200 is coupled to PWM modulator 1201 that performs pulse width modulation on the received clock signal 6. Modulator 1201 includes first register (H-Reg) 1202, second register (L-Reg) 1203, multiplexer 1204 and clock divider 1205. Clock divider 1205 has an input 1210 for receiving clock signal 6 and an output 1211 that forms the output of modulator 1201, for output of a modulated clock signal, i.e. modulated clock signal 8. In one example the output of modulator 1201 one of modulated clock signals 1207-1209. Modulated clock signal 1207 has a 75% duty cycle which indicates the start of a data frame; modulated clock signal 1208 has a 50% duty cycle which indicates a "1"; and modulated clock signal 1209 has a 25% duty cycle which indicates a "0." H-Reg 1202 is coupled to processing logic 1200 and to a first input of multiplexer 1204, L-Reg 1203 is coupled to processing logic 1200 and to a second input of multiplexer 1204. The output of multiplexer 1204 is coupled to clock divider 1205 and multiplexer 1204 is coupled to output 1211 of clock divider 1205. In one example clock divider 1205 is a counter that counts down based on input clock signal 1206 and when it reaches zero it toggles its output (from low to high or vice versa). Multiplexer 1204 is a selector that loads the content of H-reg or L-reg into clock divider 1205 depending on its selector bit which is connected to output 1211 of clock divider 1205. When the modulated clock signal at output 1211 is high multiplexer 1204 loads the H-Reg into clock divider 1205 and, when counter's output is low it selects the L-Reg to be loaded into the clock divider 1205. H-Reg 1202 holds a value that determines how long the output of the counter should stay high and L-Reg 1203 holds the value that determines how long the output of the counter should stay low. In this example, processing logic 1200 includes an input 1211 that receives digital input indicating operational characteristic signals from sensors, that may be the '1' and '0's from sensors 9-9h, and converts them to appropriate values for H-reg and L-reg to create the desired duty cycles.

In one example, when the input at 1212 is '1' processing logic 1200 loads H-Reg with 2 and L-Reg with 2 and by doing so amount of time that the modulated clock signal output at 1211 will stay high or low will be equal, to generate a 50% duty-cycle modulated clock signal 1208 at output 1211. In another example, when the input at 1212 is '0' processing logic 1200 loads the H-reg with 1 and L-reg with 3 such that the modulated clock signal output at 1211 will stay low for three input clock cycles and stay high for only one clock cycle, so as to generate a 25% duty cycle modulated clock signal 1209 at output 1211. In one example, processing logic 1200 generates a series of 1 and 0 bits, based on received operational characteristic signals 10 or input 1211, and controls modulator 1201 so as to transmit the generated series of 1 and 0 bits so at to transmit information regarding the received operational characteristic signals 10 at output 1211.

In the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

The invention claimed is:

1. A timing device comprising:
   an oven having a chamber, the oven having a heating element to heat the chamber;
   a crystal oscillator disposed in the chamber, the crystal oscillator to generate a clock signal;
   one or more sensors to generate one or more operational characteristic signals, respective ones of the one or more operational characteristic signals indicative of respective operational characteristics of the crystal oscillator or the oven;
   a plurality of input and output (I/O) connections; and
   an integrated circuit (IC) device coupled to the I/O connections, the crystal oscillator and the one or more sensors, the IC device including:

a processing logic coupled to the one or more sensor to receive the one or more operational characteristic signals and generate information that indicates how the generated clock signal is to be modified; and a modulator coupled to the processing logic to receive the information and coupled to the crystal oscillator to receive the generated clock signal, the modulator to modulate the generated clock signal in relation to the information to generate a modulated clock signal indicative of the one or more operational characteristics of the crystal oscillator or the oven, the modulator coupled to one or more of the I/O connections to output the modulated clock signal over a single one of the plurality of I/O connections.

2. The timing device of claim 1 wherein the one or more sensors comprise one or more analog sensors that generate respective analog operational characteristic signals, the IC device comprising:

an analog to digital converter to convert respective ones of the analog operational characteristic signals into a corresponding digitized operational characteristic signal indicative of the respective operational characteristic of the crystal oscillator or the oven, the processing logic to receive respective digitized operational characteristic signals and to use the digitized operational characteristic signals to generate the information.

3. The timing device of claim 1 wherein the one or more sensors comprise two or more sensors, the IC device comprising:

a multiplexer having two or more inputs that are coupled to respective ones of the two or more sensors, the multiplexer to multiplex respective ones of the two or more operational characteristic signals to generate a combined signal indicative of the respective operational characteristics of the crystal oscillator or the oven, wherein the processing logic is coupled to an output of the multiplexer to receive the combined signal, and the processing logic uses the combined signal to generate the information.

4. The timing device of claim 3 wherein the two or more sensors comprise one or more analog sensors that generate respective analog operational characteristic signals, the IC device comprising:

an analog to digital converter having inputs coupled to respective outputs of the one or more analog sensors and having an output coupled to a respective input of the multiplexer, the analog to digital converter to convert respective ones of the analog operational characteristic signals into a corresponding digitized operational characteristic signal indicative of the respective operational characteristic of the crystal oscillator or the oven.

5. The timing device of claim 3, wherein one or more of the two or more sensors are analog sensors that generate respective analog operational characteristic signals indicative of a respective operational characteristic of the crystal oscillator or the oven, the IC device comprising:

an analog to digital converter coupled to the one or more analog sensors and coupled to a respective input of the multiplexer, the analog to digital converter to convert respective ones of the analog operational characteristic signals into a corresponding digitized operational characteristic signal indicative of the respective operational characteristic of the crystal oscillator or the oven, wherein one or more of the two or more sensors are digital sensors that generate respective digital operational characteristic signals indicative of a respective operational characteristic of the crystal oscillator or the oven, the one or more digital sensors coupled to respective inputs of the multiplexer, wherein the multiplexer multiplexes the digitized operational characteristic signals and the digital operational characteristic signals to generate the combined signal.

6. The timing device of claim 3 wherein the plurality of I/O connections consist of four connections.

7. The timing device of claim 3, wherein the two or more sensors comprise a temperature sensor to generate a temperature signal that indicates a temperature of the crystal oscillator, and one of the two or more operational characteristic signals is the temperature signal.

8. The timing device of claim 3, wherein the two or more sensors comprise a pressure sensor to generate a pressure signal that indicates a pressure of the crystal oscillator, and one of the two or more operational characteristic signals is the pressure signal.

9. The timing device of claim 3, wherein the two or more sensors comprise a voltage sensing circuit to generate a voltage signal that indicates a voltage level of the crystal oscillator or the oven, and one of the two or more operational characteristic signals is the voltage signal.

10. The timing device of claim 3, wherein the two or more sensors comprise a current sensing circuit to generate a current signal that indicates a current level of the crystal oscillator or the oven, and one of the two or more operational characteristic signals is the current signal.

11. A method comprising:

generating a clock signal at a crystal oscillator disposed in a chamber of an oven, the oven having a heating element to heat the chamber;

generating one or more operational characteristic signals indicative of one or more operational characteristics of the crystal oscillator or the oven;

generating information using the one or more operational characteristic signals, the information indicative of how the generated clock signal is to be modified;

modulating the generated clock signal in relation to the information to generate a modulated clock signal indicative of the one or more operational characteristics of the crystal oscillator or the oven; and outputting the modulated clock signal.

12. The method of claim 11 wherein the one or more operational characteristic signals comprise two or more operational characteristic signals, the method including multiplexing the two or more operational characteristic signals to generate a combined signal indicative of the respective operational characteristics of the crystal oscillator or the oven, the generating information using the combined signal.

13. The method of claim 11 wherein one or more of the operational characteristic signals are analog operational characteristic signals, the method comprising converting respective ones of the analog operational characteristic signals into a corresponding digitized operational characteristic signal.

14. The method of claim 13 wherein one or more of the operational characteristic signals are digital operational characteristic signals, the method comprising:

combining the one or more digitized operational characteristic signals with the one or more digital operational characteristic signal to generate a combined signal prior to generating the information, and wherein the generating information is performed using the combined signal.

15. The method of claim 11 wherein the one or more operational characteristic signals are selected from a group consisting of a temperature signal, a pressure signal, a voltage signal and a current signal.

16. The method of claim 11 wherein the one or more operational characteristic signals comprise a temperature signal, a pressure signal, and a voltage signal that indicates a voltage level of the crystal oscillator or the oven or a current signal that indicates a current level of the crystal oscillator or the oven.

17. The method of claim 11 wherein the one or more operational characteristic signals comprise a temperature signal that indicates a temperature of the crystal oscillator.

18. The method of claim 11 wherein the one or more operational characteristic signals comprise a pressure signal that indicates a pressure of the crystal oscillator.

19. The method of claim 11 wherein the one or more operational characteristic signals comprise a voltage signal that indicates a voltage level of the crystal oscillator or the oven.

20. The method of claim 11 wherein the one or more operational characteristic signals comprise a current signal that indicates a current level of the crystal oscillator or the oven.

* * * * *